(12) United States Patent
Ma et al.

(10) Patent No.: US 6,600,389 B2
(45) Date of Patent: Jul. 29, 2003

(54) TAPERED STRUCTURES FOR GENERATING A SET OF RESONATORS WITH SYSTEMATIC RESONANT FREQUENCIES

(75) Inventors: Qing Ma, San Jose, CA (US); Peng Cheng, Campbell, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/870,857

(22) Filed: May 30, 2001

(65) Prior Publication Data

US 2002/0180563 A1 Dec. 5, 2002

(51) Int. Cl.[7] .............................. H03H 9/15; H03H 9/46; H03H 9/05; H03H 9/125; H03H 3/007
(52) U.S. Cl. ................... 333/186; 333/197; 333/200
(58) Field of Search ........................... 333/186, 197, 333/200, 202

(56) References Cited

U.S. PATENT DOCUMENTS

| | | | | |
|---|---|---|---|---|
| 4,763,089 A | * | 8/1988 | Pon | 333/202 |
| 5,001,933 A | * | 3/1991 | Brand | 73/651 |
| 5,662,782 A | * | 9/1997 | Gomi et al. | 204/192.34 |
| 5,856,722 A | * | 1/1999 | Haronian et al. | 310/321 |
| 5,883,575 A | * | 3/1999 | Ruby et al. | 333/187 X |
| 5,976,994 A | * | 11/1999 | Nguyen et al. | 438/795 |
| 5,994,982 A | * | 11/1999 | Kintis et al. | 333/235 |
| 6,079,274 A | * | 6/2000 | Ando et al. | 73/649 |
| 6,204,737 B1 | * | 3/2001 | Ellä | 333/187 |

OTHER PUBLICATIONS

Nguyen, C. T.–C., "Micromachining Technologies For Miniaturized Communication Devices", *Proceedings of SPIE: Micromachining and Microfabrication*, Santa Clara, California, (Sep. 20–22, 1998), pp. 24–38.

Stix, Gary, "The Triumph Of The Light", *Scientific American*, (Jan. 2001), pp. 81–86.

Bishop, David J. et al., "The Rise Of Optical Switching", *Scientific American*, (Jan. 2001), pp. 88–94.

* cited by examiner

Primary Examiner—Barbara Summons
(74) Attorney, Agent, or Firm—Blakely, Sokoloff, Taylor & Zafman LLP

(57) ABSTRACT

A method for forming a microelectromechanical (MEMS) resonator is disclosed. The method comprises first manufacturing a plurality of resonator structures. Each of the resonator structures differ from the others in a systematic manner, such as the length of the resonator structure. The resonance frequency of each of the resonator structures is determined. Then, a desired resonator structure is selected based upon the resonance frequency of the desired resonator structure.

18 Claims, 9 Drawing Sheets

TAPERED STRUCTURES FOR GENERATING A SET OF RESONATORS WITH SYSTEMATIC RESONANT FREQUENCIES

TECHNICAL FIELD OF THE INVENTION

This invention relates to microelectromechanical system (MEMS) resonators, and more particularly, to a set of resonators that can be selectable to a desired resonance frequency.

BACKGROUND OF THE INVENTION

The advantages of using single crystal semiconductors such as silicon as a mechanical material have long been recognized. For example, it's strength and high intrinsic quality factor make it attractive for MEMS resonant devices. It is regularly available as an integrated circuit substrate and can be processed using methods developed by the IC industry. Recently, the preferred material for forming MEMS resonators is polycrystalline silicon, or simply, polysilicon. This material is advantageous because it is readily used in integrated circuits (often used as transistor gates), provides flexibility in geometry, and ease of use.

MEMS resonators are now being developed for signal filtering and for use as clocks in oscillators. However, for a MEMS resonator, the resonance frequency of the resonator after the manufacturing process is usually different from the desired value due to processing variations. Thus, although one may desire to have a MEMS resonator have a resonance frequency of 1 GHz, during the actual manufacturing process, it is difficult to manufacture a MEMS resonator with exactly a resonance frequency of 1 GHz. While there are post-manufacturing techniques, such as laser trimming, that may be used to adjust the resonance frequency of the MEMS resonator, this laser trimming is also difficult to accurately control. Therefore, it is costly and/or difficult to precisely manufacture a MEMS resonator having the desired resonance frequency.

BRIEF DESCRIPTION OF THE FIGURES

The invention is best understood by reference to the figures wherein references with like reference numbers generally indicate identical, functionally similar, and/or structurally similar elements. The drawing in which an element first appears is indicated by the leftmost digit(s) in the reference number in which.

DETAILED DESCRIPTION OF THE PREFERRED EMBODIMENTS

Embodiments of a tapered set of resonators are described in detail herein. In the following description, numerous specific details are provided in order to provide a thorough understanding of embodiments of the invention. One skilled in the relevant art will recognize, however, that the invention can be practiced without one or more of the specific details, or with other methods, materials, components, etc. In other instances, well known structures, materials, or operations are not shown or described in detail to avoid obscuring aspects of various embodiments of the invention. Furthermore, it is understood that the various embodiments shown in the Figures are illustrative representations, and are not necessarily drawn to scale.

Reference throughout the specification to "one embodiment" or "an embodiment" means that a particular feature, structure, material, or characteristic described in connection with the embodiment is included in at least one embodiment of the present invention. Thus, the appearances of the phrase "in one embodiment" or "in an embodiment" in various places throughout the specification are not necessarily all referring to the same embodiment. Furthermore, the particular features, structures, materials, or characteristics may be combined in any suitable manner in one or more embodiments.

The manufacture and use of MEMS resonators for filtering or oscillator applications is now being developed, with commercial adoption envisioned shortly. Typically, polysilicon is used as the resonator material. Two common types of MEMS resonators are: (1) the "bending beam" structure and (2) the "breathing bar" structure. In a bending beam structure, a beam of polysilicon material is elevated above a semiconductor substrate by anchors at both ends of the beam. The beam is excited by an electrical input that can induce mechanical vibration in the beam. Typically, the electrical input is provided from below the beam. Further, although the bending beam and breathing bar structures are described below in the preferred embodiment, the present invention can apply equally well to other types of resonator structures. Thus, the term resonator structure used herein refers to a MEMS structure that resonates. For example, cantilever beams with only one end anchored is another type of resonator structure. In addition, the bridge beams and cantilever beams can vibrate not only vertically using an exciting electrode underneath the beam, but also can vibrate in the direction parallel to the substrate by using side electrodes.

Figure 1:
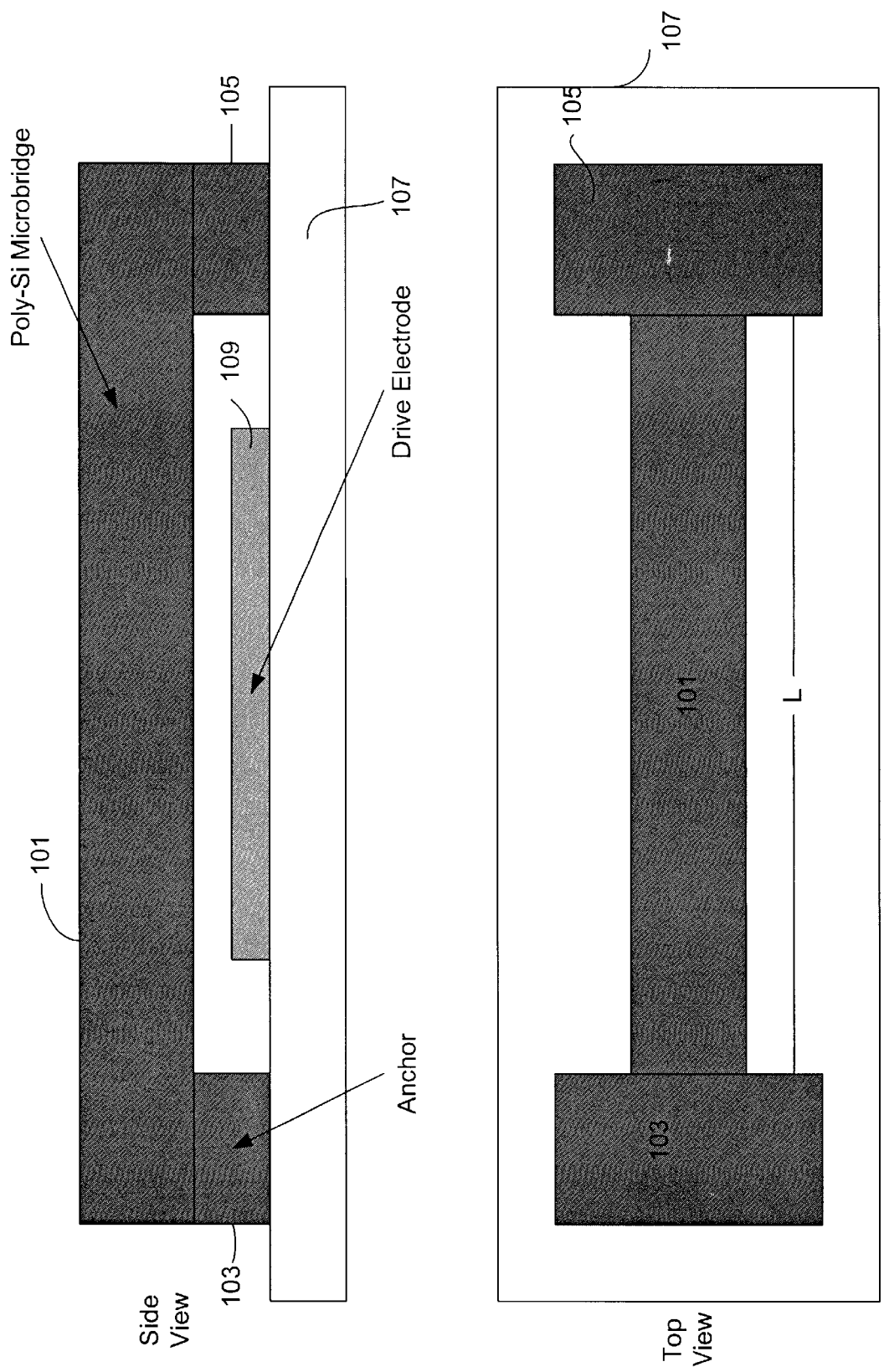
FIG. 1 illustrates a prior art bending beam MEMS resonator.

FIG. 1 shows an exemplary prior art bending beam structure. As seen in FIG. 1, a bending beam 101 is suspended at its ends above a semiconductor substrate 107 by anchors 103 and 105. The anchors 103 and 105 are secured to the substrate 107. A drive electrode 109 is placed underneath the bending beam 101. The drive electrode 109 is used to excite the bending beam 101 into vibrating. As is known in the art, the resonance frequency of the bending beam 101 is based upon several parameters, including the thickness of the beam, the density of the material forming the beam, the Young's modulus of the beam, and the length of the beam. Specifically, $$\omega \propto \frac{t}{L^2}\sqrt{\frac{E}{\rho}}$$

where ω is the resonance frequency, t is the thickness of the beam, L is the length of the beam, E is the Young's modulus of the beam material, and ρ is the density of the beam material. As seen above, the length of the beam is particularly important in determining the resonance frequency of the beam. Referring back to FIG. 1, the length of the beam is the length L between the anchors 103 and 105. Thus, one effective method for varying the resonance frequency of the bending beam is to vary the length of the bending beam 101.

Figure 2:
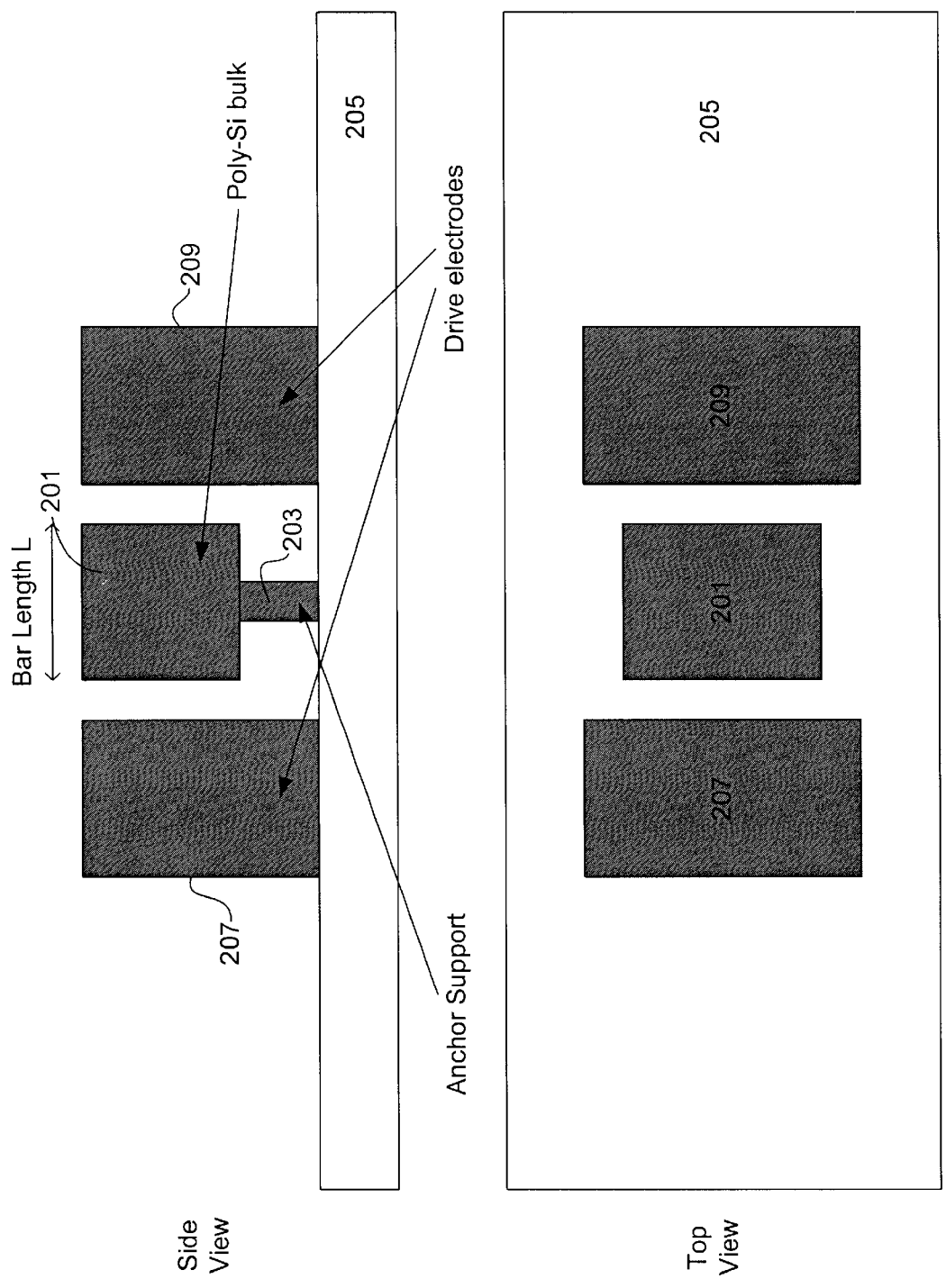
FIG. 2 illustrates a prior art breathing bar MEMS resonator.

FIG. 2 shows an exemplary prior art breathing bar structure. As seen in FIG. 2, a polysilicon bar 201 is suspended above a substrate 205 by an anchor support 203. Drive electrodes 207 and 209 disposed on opposite sides of the breathing bar 201 excite the breathing bar 201 to vibrate at the resonance frequency. Again, the resonance frequency of the breathing bar 201 depends upon many physical parameters, but primarily depends upon the length L of the breathing bar 201. Specifically, $$\omega \propto \frac{1}{L}\sqrt{\frac{E}{\rho}}$$

where ω is the resonance frequency, L is the length of the bar, E is the Young's modulus of the beam material, and ρ is the density of the beam material. As seen above, the length of the bar is particularly important in determining the resonance frequency of the bar.

While it is preferred that the resonance frequency of a MEMS resonator be precisely controlled by varying the size and characteristics of the breathing bar or bending beam structure, in practical manufacturing processes, it is not always possible to precisely control these parameters. Therefore, post-manufacturing processing, such as laser trimming is necessary to correct the actual manufactured resonance frequency to the desired resonance frequency. Specific details for the manufacturing and operation of a MEMS resonator can be found in "Micromachining Technologies for Miniaturized communication devices," by C. T. C. Nguyen, *Proceedings of SPIE*: Micromachining and Microfabrication, Santa Clara, Calif., Sep. 20–22, 1998, pages 24–38.

Figure 3:
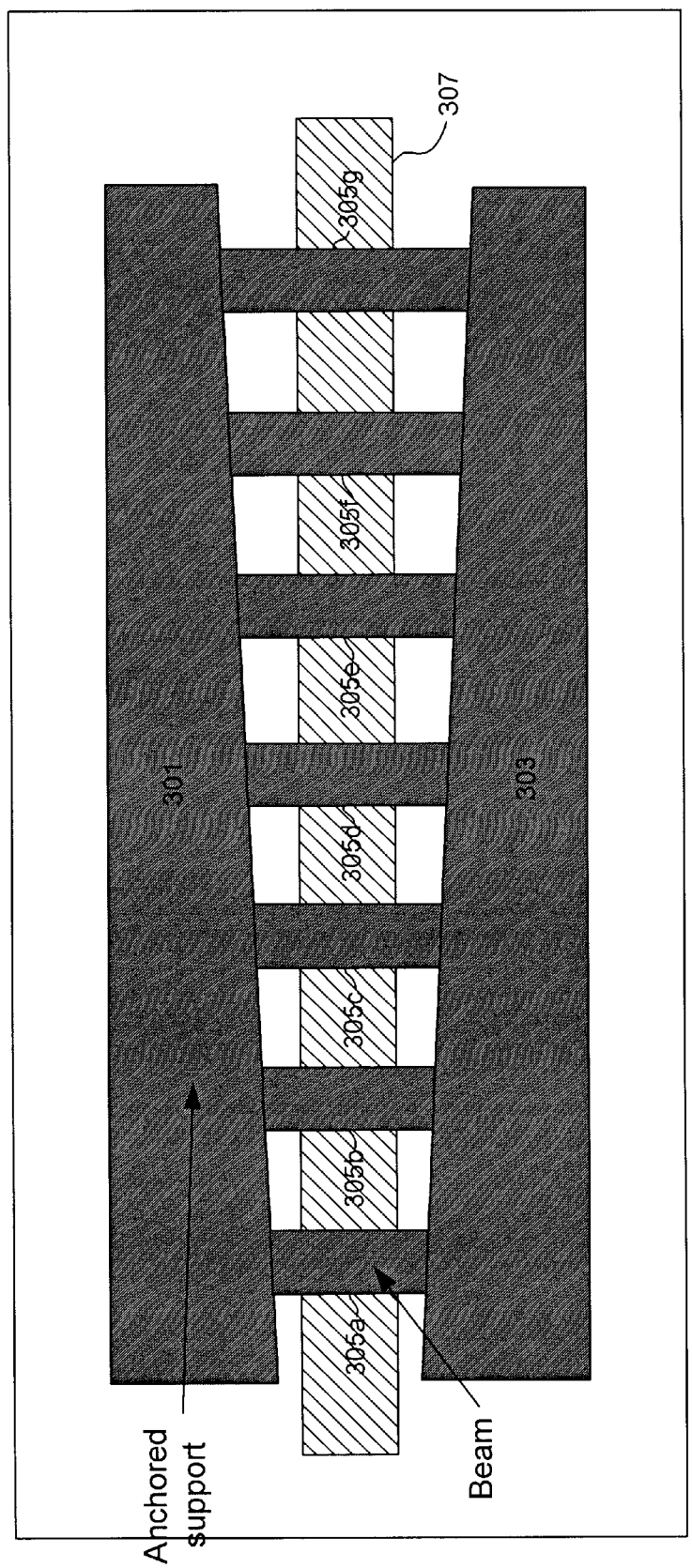
FIG. 3 illustrates a set of bending beam resonators formed in accordance with the present invention.

In accordance with the present invention, a set of bending beams with systematically varying lengths are formed. In one embodiment, the bending beams are formed of varying length by using tapered supporting anchor structures. Turning to FIG. 3, two anchor supports 301 and 303 are tapered so that the distance between them varies at different points along the anchored support. Therefore, a plurality of bending beams 305a–g (forming a set) are formed that bridge the distance between the anchored structures 301 and 303. Further, formed underneath the bending beams 305a–g is an exciting electrode 307. The exciting electrode extends beneath each of the bending beams 305a–g, so as to be capable of exciting any of the bending beams 305a–g.

As seen in FIG. 3, the bending beam 305g has the longest length and the bending beam 305a has the shortest length. In accordance with the relationship discussed above, the longest beam 305g has the lowest resonance frequency, while the shortest bending beam 305a has the highest resonance frequency.

Preferably, the variation in length between the shortest and longest bending beam will cause a difference in resonance frequency between the shortest and longest bending beam that is sufficient to account for the variation of resonance frequency due to manufacturing tolerances of a typical bending beam structure. Moreover, the resonance frequency increment between adjacent bending beams should be smaller than the targeted frequency variation tolerance of the desired resonator so that at least one of the bending beams 305a through 305g is qualified to act as the desired resonator.

As an example, assume that the desired frequency of a MEMS resonator is 1 GHz. Assume further that the desired frequency MEMS resonator should have a tolerance of no more than plus or minus 10 MHz. In accordance with the present invention and the principles set forth above, the shortest and longest bending beams of the set of bending beams should have resonance frequencies designed to encapsulate the desired resonance frequency of 1 GHz. In the example of FIG. 3, the middle bending beam 305d should be designed to have the appropriate length so as to provide a resonance frequency of 1 GHz, assuming a perfect manufacturing process. The adjacent bending beams have varying length that will provide a resonance frequency that are lower than 1 GHz and higher than 1 GHz in a systematically incremented and decremented fashion. Further, the difference in length between adjacent bending beams 305 should be sufficiently small so as to result in a less than 10 MHz variation in resonance frequency.

Because the bending beams 305a–g are physically close to each other, the thickness, modulus and density variations amongst the bending beams are insignificant. Therefore, by changing the length systematically, the resonance frequency can be also changed systematically. For example, if the thickness of the bending beams 305a–g is slightly larger than optimal design, then all of the bending beams have their resonance frequency shifted equally. In other words, process variations that affect the resonance frequency of one bending beam would likely affect the resonance frequency of other bending beams in an equal non-discriminatory fashion. By controlling a single parameter that has a relatively large influence on the resonance frequency, i.e. controlling the length of the bending beam, a set of bending beams having different resonance frequencies can be developed.

Figure 4:
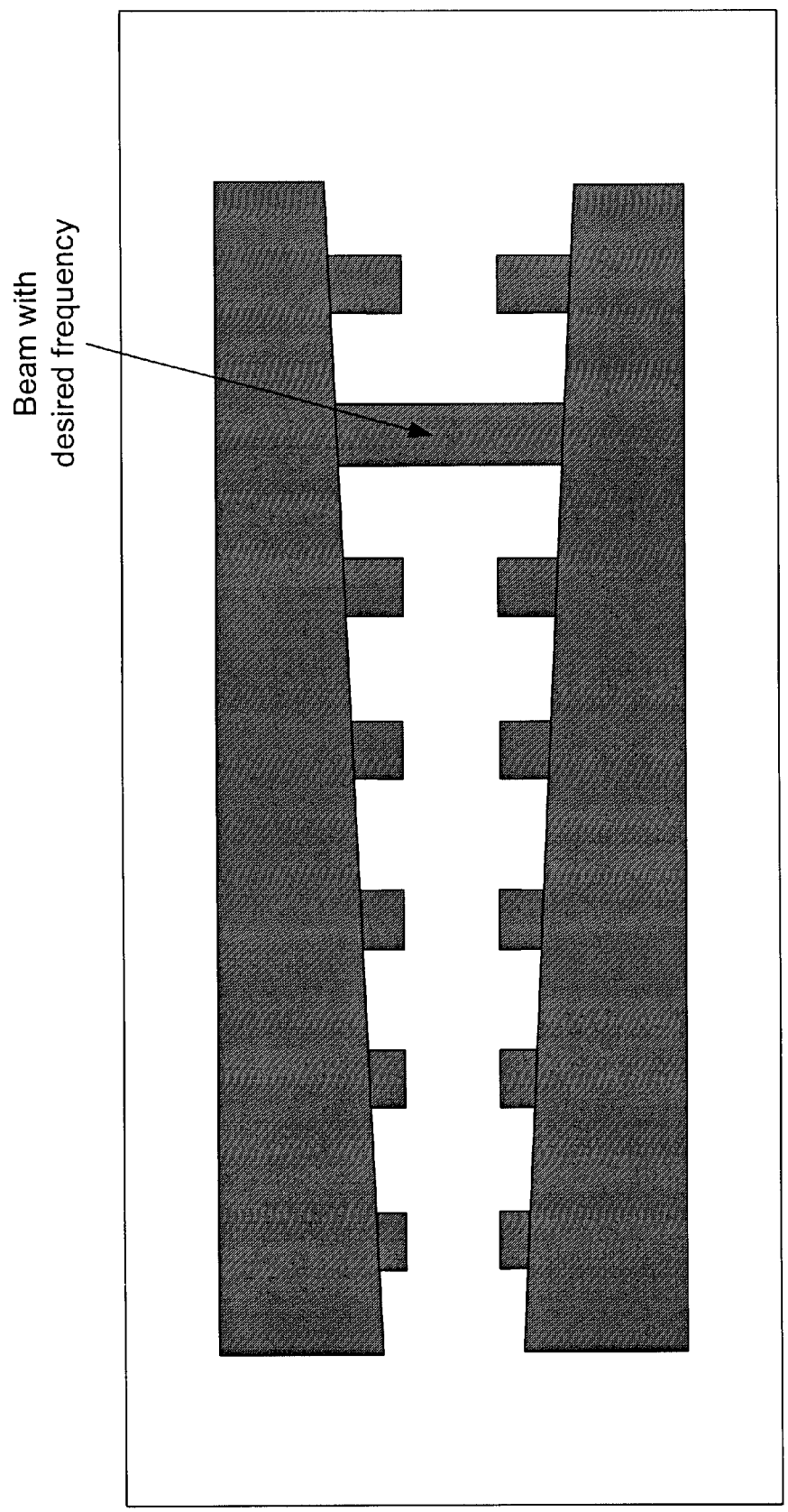
FIG. 4 illustrates a bending beam MEMS resonator formed in accordance with the present invention.

Turning next to FIG. 4, once the set of bending beams has been manufactured, a post-processing measurement technique is used to measure the resonance frequency of each of the bending beams. For example, a network analyzer may be used to excite the exciting electrode 307 at a precise frequency. The response of the bending beams can then be measured. Such a measurement is known as a S-parameter measurement. Thus, the input exciting frequency provided by the network analyzer to the exciting electrode can be scanned from the lowest possible to the highest possible frequency. When the input frequency coincides with the resonance frequency of a particular beam, the beam will resonate, causing the S-parameter to change rapidly with frequency, or on the S-parameter vs. frequency curve, a sharp peak can be seen. Because the resonance frequency of a beam is sufficiently different from the resonance frequency of other beams, the other bending beams are not excited. It can be appreciated that the magnitude of the resonance movement, thus the response, is much bigger at resonance than not. Such a scan performed by the network analyzer will determine the resonance frequency of all of the bending beams.

Alternatively, an optical technique may be used to determine the resonance frequency of the beams. For example, a laser beam can be focused on a bending beam while a short sharp electrical pulse is applied to the exciting electrode to excite the resonance. A sharp pulse contains all frequencies; so all bending beams are excited at their own resonance frequency. Once excited, laser deflection or Doppler vibrometer techniques can be used to measure frequency. Following measurement of the resonance frequencies, the specific bending beam within the set of bending beams that has a resonance frequency that is closest to the desired resonance frequency is identified. The remaining bending beams are then disabled, i.e. cut, using focused ion beam (FIB) or laser assisted etching. FIB is an accelerated beam is used to cut things precisely. In both FIB and laser assisted etching, a chemical gas is introduced into a process chamber, and the ion beam or the laser beam is pointed to the position needed to be etched. The ion or laser energy provides the activation energy needed for the chemical reaction. The reaction products are in gas phase and are pumped away.

Thus, in accordance with the present invention, a set of bending beams are formed adjacent to each other having varying lengths. However, the bending beams are formed using the same manufacturing process and therefore, variations in thickness, modulus, and density are small. The length of the various bending beams can be controlled in different ways. In one embodiment, the bending beams may have separate anchor supports that are located at different distances apart. In another embodiment, the bending beams may have common anchor supports, wherein the anchor supports have a tapered profile so along the length of the anchor supports, the distances between the two anchor supports vary.

Figure 5:
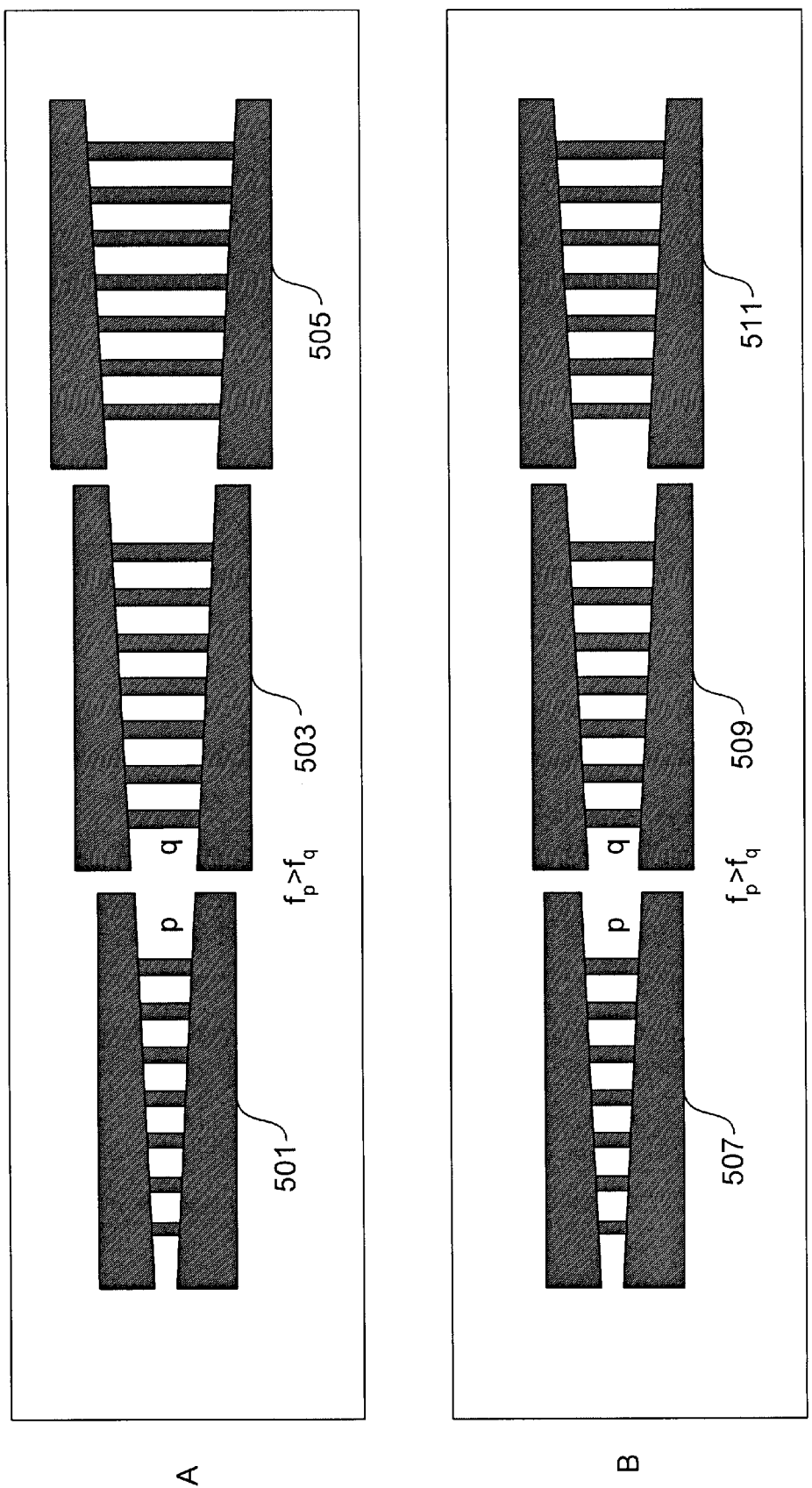
FIGS. 5A and 5B illustrate a plurality of sets of bending beam resonators formed in accordance with the present invention.

There are certain applications of MEMS resonators, such as signal filters, that require multiple MEMS resonators. For such an application, the apparatus and techniques of the present invention can be expanded to provide multiple sets of bending beams. For example, turning to FIG. 5a, three distinct sets of bending beams 501, 503, and 505 are arranged adjacent to each other. Each of the sets of the bending beams include a plurality of bending beams that have variable length. Each set of bending beams is targeted to generate one bending beam of the desired frequency. Therefore, the frequency range of the set of bending beams should be slightly larger than manufacturing variation and the beam to beam increment (between bending beams in a set) should be smaller than the frequency tolerance for that targeted frequency. The desired resonance frequency of the bending beam for each of the three sets 501, 503 and 505 is then determined and after the undesired bending beams have been severed, a set of three resonators remains. In FIG. 5a, the adjacent sets of bending beams 501, 503 and 505 do not have beams of overlapping length. In FIG. 5b, adjacent sets of bending beams 507, 509, and 511 have overlapping length.

Figure 6:
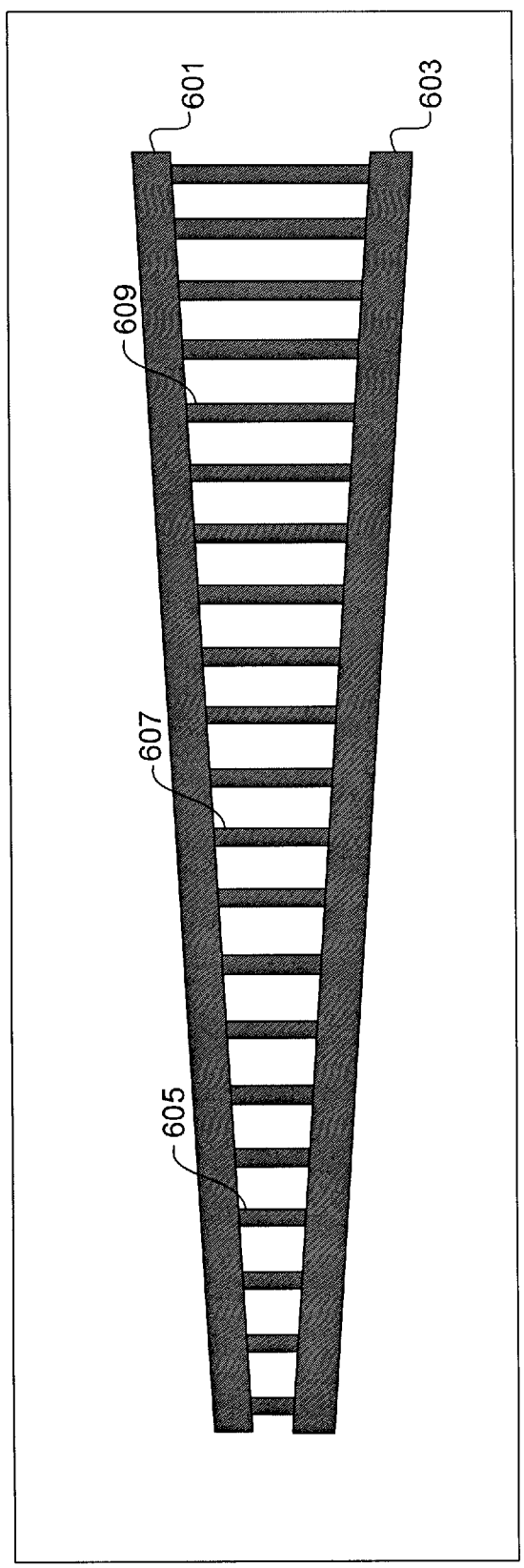
FIG. 6 illustrates a set of bending beam resonators used for a MEMS multi-resonator structure formed in accordance with the present invention.
Figure 7:
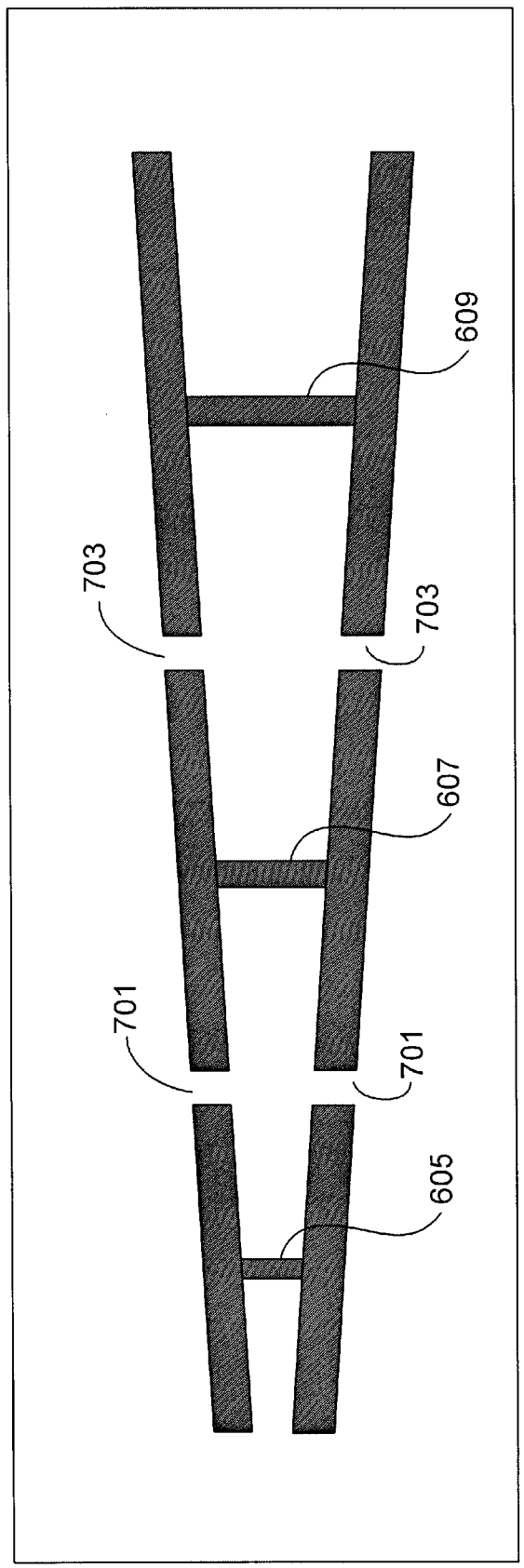
FIG. 7 illustrates a MEMS multi-resonator formed in accordance with the present invention.

Turning to FIG. 6, in the case where adjacent structures have beams of overlapping length as shown in FIG. 5b, particularly if the overlapping is substantial, it is more space efficient to group them together and to eliminate the overlapping beams. Therefore, in such a situation, a "super" set of bending beams is formed sharing common anchor supports. Then, each of the desired bending beams that are at the desired resonant frequencies are selected. In FIG. 6, the desired bending beams are designated by reference numerals 605, 607, and 609. The remaining bending beams are then severed. Because there needs to be isolation between MEMS resonators, the anchor supports 601 and 603 need to be separated or segmented so that none of the desired bending beams 605, 607, or 609 are supported by common portions of anchor supports 601 and 603. Thus, turning to FIG. 7, the anchor support structures 601 and 603 are severed at points 701 and 703 to provide isolation.

Figure 8:
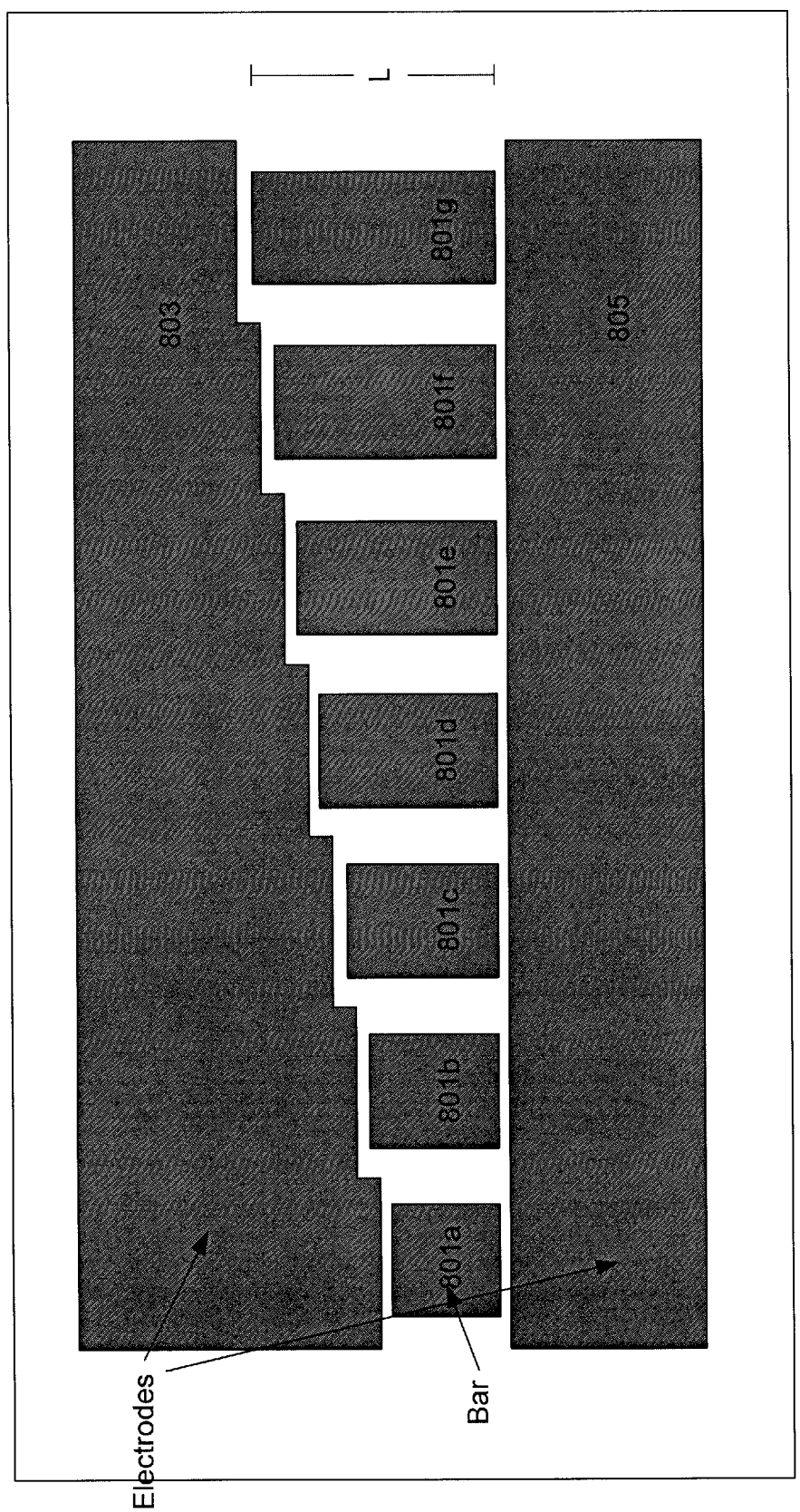
FIG. 8 illustrates a set of breathing bar resonators formed in accordance with the present invention.

The techniques of the present invention can be applied also to a breathing bar MEMS resonator. As noted above, the resonance frequency of the breathing bar structure is related to the length of the breathing bar. As seen in FIG. 8, a plurality of breathing bars 801a–801g (shown in top view) are shown placed between two exciting electrodes 803 and 805. The length parameter of the breathing bars 801a–801g is measured in the direction between between the exciting electrodes 803 and 805. FIG. 8 shows the length L of breathing bar 801g. Similar to the bending beam structure, the resonance frequency is based upon the Young's modulus and density of the material of the bar. For a set of breathing bars closely adjacent on a wafer and formed using the same manufacturing process, the modulus and density variations are small. Therefore, by changing the length systematically, the resonance frequency can also be changed systematically.

Because the breathing bars 801a–g are physically close to each other, modulus and density variations amongst the breathing bars are insignificant. Therefore, by changing the length systematically, the resonance frequency can be also changed systematically. For example, if the density of the material forming the breathing bars 801a–g is slightly higher than optimal design, then all of the breathing bars have their resonance frequency shifted equally. In other words, process variations that affect the resonance frequency of one breathing bar would likely affect the resonance frequency of other breathing bars in an equal non-discriminatory fashion. By controlling a single parameter that has a relatively large influence on the resonance frequency, i.e. controlling the length of the breathing bar, a set of breathing bars having different resonance frequencies can be developed.

Preferably, the variation in length between the shortest and longest breathing bar will cause a difference in resonance frequency between the shortest and longest breathing bar that is sufficient to account for the variation of resonance frequency due to manufacturing tolerances of a typical breathing bar structure. Moreover, the resonance frequency increment between adjacent breathing bars should be smaller than the targeted frequency variation tolerance of the desired resonator so that at least one of the breathing bars 801a through 801g is qualified to act as the desired resonator.

The manufacturing process for making breathing bars of variable length can be easily done during the photolithography step. In other words, the lengths of the breathing bars can be defined by the photolithography mask used to form the breathing bars and/or the exciting electrodes.

Recognizing that there may be variation in the photolithography mask, the present invention accommodates these variations. For example, it may occur that all of the breathing bars are made slightly larger than desired. In such as case, a breathing bar with a designed length smaller than the targeted length for the desired resonator would have the actual length within tolerance of the desired length.

Returning to FIG. 8, the longest breathing bar 801g has the lowest resonance frequency. The frequency span from the longest breathing bar 801g to the shortest breathing bar 801a is larger than the processing related variation in resonance frequency of a typical breathing bar. In other words, the range of the breathing bars 801a through 801g should be sufficient to accommodate any process variations. Furthermore, the frequency increment between adjacent breathing bars should be smaller than the desired tolerance of the resonator so that at least one of the breathing bars is qualified.

As an example, assume that the desired frequency of a MEMS resonator is 1 GHz. Assume further that the desired frequency MEMS resonator should have a tolerance of no more than plus or minus 10 MHz. In accordance with the present invention and the principles set forth above, the shortest and longest breathing bars of the set of breathing bars should have resonance frequencies designed to encapsulate the desired resonance frequency of 1 GHz. In the example of FIG. 8, the middle bending beam 801d should be designed to have the appropriate length so as to provide a resonance frequency of 1 GHz, assuming a perfect manufacturing process. The adjacent breathing bars have varying length that will provide a resonance frequency that are lower than 1 GHz and higher than 1 GHz in a systematically incremented and decremented fashion. Further, the difference in length between adjacent breathing bars 801 should be sufficiently small so as to result in a less than 10 KHz variation in resonance frequency.

Figure 9:
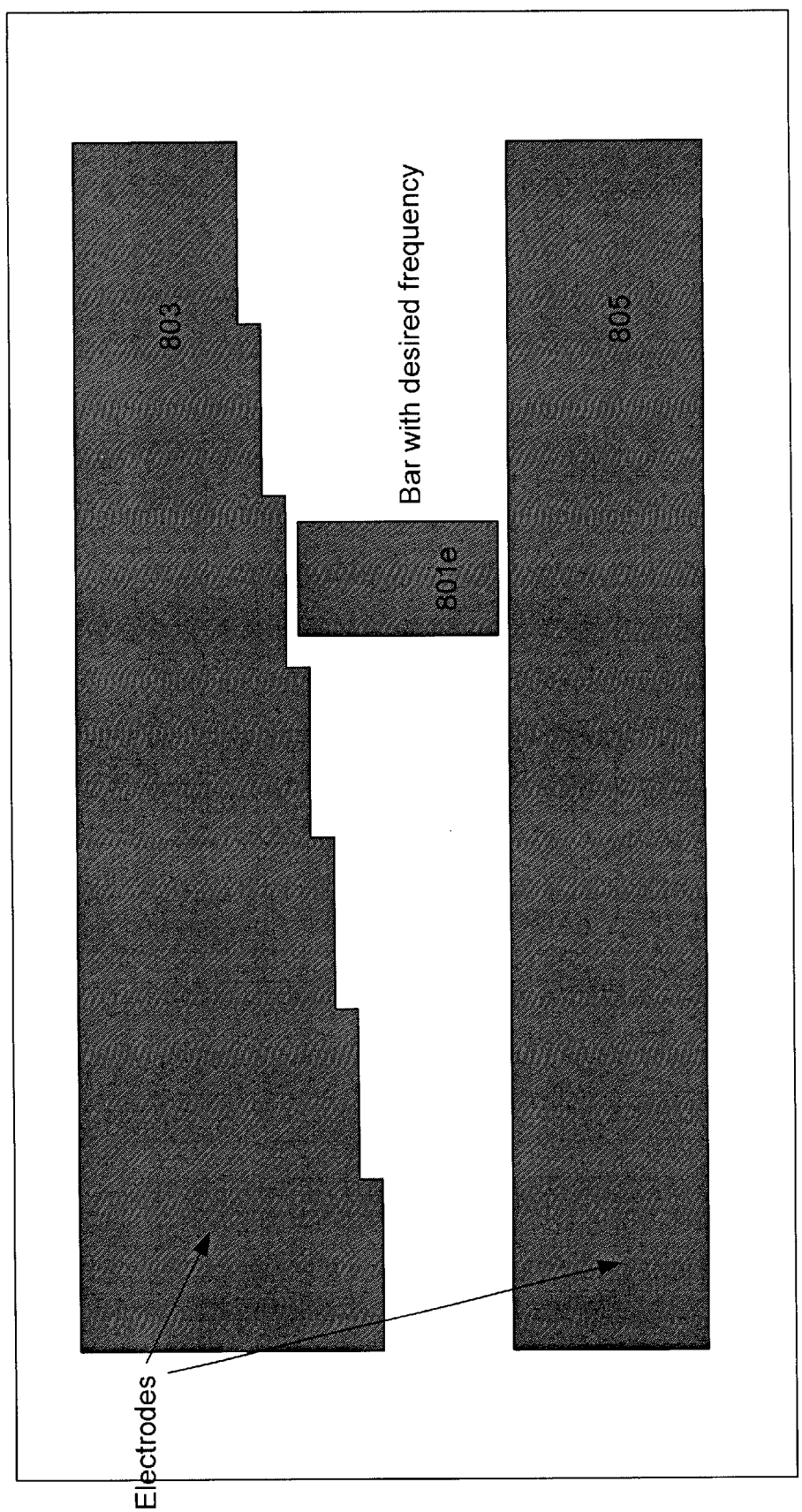
FIG. 9 illustrates a breathing bar MEMS resonator formed in accordance with the present invention.

Turning next to FIG. 9, once the set of breathing bars has been manufactured, a post-processing measurement technique is used to measure the resonance frequency of each of the breathing bars. The measurement techniques used above with regard to the bending beam embodiment may also be used with the breathing bar techniques. Following measurement of the resonance frequencies, the specific breathing bar within the set of breathing bar that has a resonance frequency that is closest to the desired resonance frequency is identified. The remaining breathing bars are then disabled, i.e. cut, using FIB or laser assisted etching.

Finally, similar to the bending beam embodiments, multiple sets of breathing bars may be used to form a multiple breathing bar MEMS resonators.

The above description of illustrated embodiments of the invention, including what is described in the abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize. For example, while the bending beam and breathing bar types of mechanical resonators have been described, other types of mechanical resonators may also be substituted into the concepts and ideas of the present invention.

These modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctorines of claim interpretation.

What is claimed is:

1. An apparatus comprising:
    a first anchor support formed on a substrate;
    a second anchor support disposed opposed to said first anchor support, said first anchor support and said second anchor support separated by a gap, said second anchor support tapered relative to said first anchor structure such that the gap between said first anchor structure and said second anchor structure is varying; and
    a selected bending beam, said selected bending beam chosen from a plurality of bending beams bridging said gap between said first anchor support and said second anchor support, said bending beams having a length that varies according to the gap distance between said first anchor support and said second anchor support, said selected bending beam exhibiting a desired resonance frequency;
    wherein the remaining plurality of bending beams except for the selected bending beam are disabled.

2. The apparatus of claim 1 further comprising an exciting electrode disposed underneath said plurality of bending beams.

3. The apparatus of claim 1 wherein said plurality of bending beams are formed from polysilicon.

4. A method comprising:
    manufacturing a plurality of bending beams, each bending beam differing from the others of said plurality of bending beams in a systematic manner, wherein said bending beams are manufactured to share common anchor supports; determining the resonance frequency of each of said plurality of bending beams; and
    selecting a desired bending beam based upon the resonance frequency of said desired bending beam.

5. The method of claim 4 wherein all of said plurality of resonator structures are disabled, except for said desired resonator structure.

6. The method of claim 4 wherein said bending beams differ from each other by length.

7. The method of claim 4 further comprising;
    forming a first anchor structure;
    forming a second anchor structure opposed to said first anchor structure; and
    forming said bending beams between said first and second anchor structures.

8. The method of claim 7 further comprising tapering said first anchor structure relative to said second anchor structure such that the distance between said first anchor structure and said second anchor structure is varying.

9. The method of claim 4 wherein said determining of the resonance frequencies is performed by:
    exciting said plurality of bending beams using an exciting electrode that is driven by a network analyzer; and
    monitoring the frequency at which each of said plurality of bending beams exhibits resonance.

10. An apparatus comprising:
    a first exciting electrode formed on a substrate;
    a second exciting electrode disposed opposed to said first exciting electrode, said first exciting electrode and said second exciting electrode separated by a gap, said second exciting electrode tapered relative to said first exciting electrode such that the gap between said first exciting electrode and said second exciting electrode is varying; and
    a selected breathing bar, said selected breathing bar chosen from a plurality of breathing bars bridging said gap between said first exciting electrode and said second exciting electrode, said breathing bars having a length that varies according to the gap distance between said first exciting electrode and said second exciting electrode, said selected breathing bar exhibiting a desired resonance frequency.

11. The apparatus of claim 10 wherein the remaining plurality of breathing bars except for the selected breathing bar are disabled.

12. The apparatus of claim 10 wherein said plurality of breathing bars are formed from polysilicon.

13. A method comprising:
    manufacturing a plurality of breathing bars, each breathing bar differing from the others of said plurality of breathing bars in a systematic manner;

determining the resonance frequency of each of said plurality of breathing bars; and selecting a desired breathing bar based upon the resonance frequency of said desired breathing bar.

14. The method of claim 13 wherein said breathing bars differ from each other by length.

15. The method of claim 14 wherein all of said plurality of breathing bars are disabled, except for said desired breathing bar, said disabling performed by focused ion beam, laser trimming, or laser assisted etching.

16. The method of claim 13 further comprising:

forming a first exciting electrode;

forming a second exciting electrode opposed to said first exciting electrode; and forming said breathing bars between said first and second exciting electrodes.

17. The method of claim 16 further comprising tapering said first exciting electrode relative to said second exciting electrode such that the distance between said first exciting electrode and said second exciting electrode is varying.

18. The method of claim 13 wherein said determining of the resonance frequencies is performed by:

exciting said plurality of breathing bars using an exciting electrode that is driven by a network analyzer; and monitoring the frequency at which each of said plurality of breathing bars exhibits resonance.

* * * * *